US011867755B2

(12) United States Patent
Yu

(10) Patent No.: US 11,867,755 B2
(45) Date of Patent: Jan. 9, 2024

(54) MEMORY DEVICE TEST METHOD, APPARATUS, AND SYSTEM, MEDIUM, AND ELECTRONIC DEVICE

(71) Applicant: CHANGXIN MEMORY TECHNOLOGIES, INC., Hefei (CN)

(72) Inventor: Yu Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 72 days.

(21) Appl. No.: 17/648,570

(22) Filed: Jan. 21, 2022

(65) Prior Publication Data

US 2022/0291284 A1 Sep. 15, 2022

Related U.S. Application Data

(63) Continuation of application No. PCT/CN2021/120069, filed on Sep. 24, 2021.

(30) Foreign Application Priority Data

Mar. 10, 2021 (CN) .......................... 202110260087.6

(51) Int. Cl.
*G01R 31/317* (2006.01)
*G01R 31/3183* (2006.01)
(Continued)

(52) U.S. Cl.
CPC . *G01R 31/31713* (2013.01); *G01R 31/31905* (2013.01); *G01R 31/31919* (2013.01);
(Continued)

(58) Field of Classification Search
None
See application file for complete search history.

(56) References Cited

U.S. PATENT DOCUMENTS 5,290,134 A * 3/1994 Baba ................. G01R 31/2851
414/754
11,221,349 B2 1/2022 Arlinsky et al.
(Continued)

FOREIGN PATENT DOCUMENTS

CN 102338624 A 2/2012
CN 103971753 A 8/2014
(Continued)

OTHER PUBLICATIONS

International Search Report cited in PCT/CN2021/120069 dated Nov. 25, 2021, 11 pages.
(Continued)

*Primary Examiner* — Guerrier Merant
(74) *Attorney, Agent, or Firm* — Cooper Legal Group, LLC

(57) ABSTRACT

The present disclosure provides a memory device test method, apparatus, and system, a medium, and an electronic device. The memory device test method includes: determining an operation path according to position coordinates of a target test platform and current position coordinates of a memory device; setting a movable apparatus according to the operation path, such that the movable apparatus moves the memory device into the target test platform according to the operation path; controlling the target test platform to test the memory device according to a target test program; and monitoring a test result of the memory device in real time, and storing the test result of the memory device into a database.

14 Claims, 6 Drawing Sheets

(51) Int. Cl.
*G01R 31/319* (2006.01)
*G01R 31/3193* (2006.01)

(52) U.S. Cl.
CPC ............ *G01R 31/31935* (2013.01); *G01R 31/318314* (2013.01)

(56) References Cited

U.S. PATENT DOCUMENTS

| | | | | |
|---|---|---|---|---|
| 2006/0066293 | A1* | 3/2006 | Gopal | G11C 29/56016 324/750.14 |
| 2008/0133166 | A1 | 6/2008 | Lai | |
| 2017/0131346 | A1 | 5/2017 | Roberts, Jr. | |
| 2022/0128622 | A1* | 4/2022 | Pei | G01R 31/2867 |
| 2022/0128625 | A1* | 4/2022 | Akers | G01R 31/2891 |

FOREIGN PATENT DOCUMENTS

| CN | 105334447 | A | | 2/2016 |
|---|---|---|---|---|
| CN | 208854075 | U | | 5/2019 |
| CN | 109839557 | A | | 6/2019 |
| CN | 110446932 | A | | 11/2019 |
| CN | 110502387 | A | | 11/2019 |
| CN | 110665832 | A | | 1/2020 |
| CN | 110861915 | A | | 3/2020 |
| CN | 210776713 | U | | 6/2020 |
| CN | 210908816 | U | | 7/2020 |
| CN | 111815634 | A | | 10/2020 |
| CN | 112988484 | A | | 6/2021 |
| TW | 200823470 | A | | 6/2008 |
| TW | I440036 | B | * | 1/2010 |

OTHER PUBLICATIONS

First Office Action cited in CN202110260087.6, dated May 7, 2022, 16 pages.

\* cited by examiner

MEMORY DEVICE TEST METHOD, APPARATUS, AND SYSTEM, MEDIUM, AND ELECTRONIC DEVICE

CROSS-REFERENCE TO RELATED APPLICATIONS

This is a continuation of International Application No. PCT/CN2021/120069, filed on Sep. 24, 2021, which claims the priority to Chinese Patent Application No. 202110260087.6, titled "MEMORY DEVICE TEST METHOD AND APPARATUS, READABLE STORAGE MEDIUM, AND ELECTRONIC DEVICE" and filed on Mar. 10, 2021. The entire contents of International Application No. PCT/CN2021/120069 and Chinese Patent Application No. 202110260087.6 are incorporated herein by reference.

TECHNICAL FIELD

The present disclosure relates to, but is not limited to, a memory device test method, apparatus, and system, a medium, and an electronic device.

BACKGROUND

With the development of computer technologies, computers have been used in all walks of life. The quality of components of the computer, especially the memory device, determines the performance of the computer. The memory device is the channel that connects the CPU to other electronic devices and plays the role of data storage and data exchange. Therefore, the test for the memory device becomes crucial for the stability of the computer performance.

In the prior art, software test platforms are developed to test memory devices, or application devices are used to test memory devices. However, both solutions require manual testing, resulting in labor and material costs, and the test results are not accurate.

SUMMARY

An overview of the subject matter detailed in the present disclosure is provided below, which is not intended to limit the protection scope of the claims.

The present disclosure provides a memory device test method, apparatus, and system, a medium, and an electronic device.

According to a first aspect, the present disclosure provides a memory device test method. The method includes: determining an operation path according to position coordinates of a target test platform and current position coordinates of a memory device; setting a movable apparatus according to the operation path, such that the movable apparatus moves the memory device into the target test platform according to the operation path; controlling the target test platform to test the memory device according to a target test program; and monitoring a test result of the memory device in real time, and storing the test result of the memory device into a database.

According to a second aspect, the present disclosure provides a memory device test apparatus. The memory device test apparatus includes: one or more processors; and a storage apparatus, configured to store one or more programs, wherein the one or more programs, when executed by the one or more processors, cause the one or more processors to execute operations of: determining an operation path according to position coordinates of a target test platform and current position coordinates of a memory device; setting a movable apparatus according to the operation path, such that the movable apparatus moves the memory device into the target test platform according to the operation path; controlling the target test platform to test the memory device according to a target test program; and monitoring a test result of the memory device in real time, and store the test result of the memory device into a database.

According to a third aspect, the present disclosure provides a memory device test system. The memory device test system includes: a movable apparatus, configured to receive an operation path, and move a memory device into a target test platform according to the operation path; the target test platform, configured to test the memory device according to a target test program in response to a test instruction; and a test server, configured to send a test instruction to the target test platform, monitor a test result of the memory device in real time, and store the test result of the memory device into a database, where the operation path is calculated by the test server according to position coordinates of the target test platform and current position coordinates of the memory device.

According to a fourth aspect, the present disclosure provides a computer readable medium storing a computer program, where the program, when executed by a processor, implements the memory device test method as described in the embodiment of the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
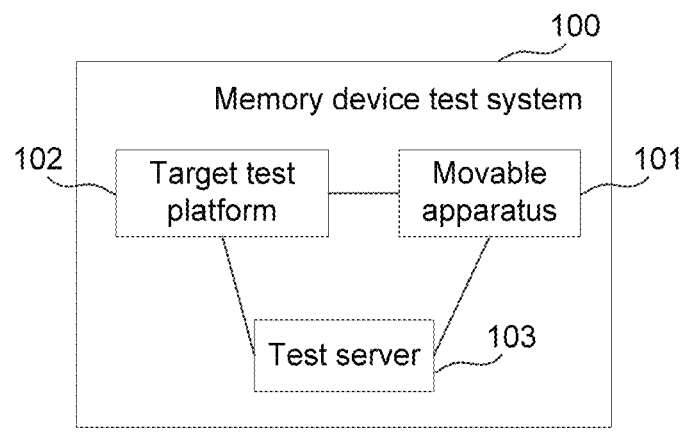
FIG. 1 is a schematic diagram of a system architecture of a memory device test system according to an embodiment of the present disclosure.

FIG. 1 is a schematic diagram of a system architecture of a memory device test system that can use the technical solution of the embodiments of the present disclosure. As shown in FIG. 1, a memory device test system 100 includes a movable apparatus 101, a target test platform 102, and a test server 103. The movable apparatus 101 is configured to receive an operation path, and move a memory device into the target test platform 102 according to the operation path; the target test platform 102 is configured to test the memory device according to a target test program in response to a test instruction; the test server 103 is configured to send a test instruction to the target test platform 102, monitor a test result of the target test platform 102 in real time, and store the test result of the memory device into a database, where the operation path is calculated by the test server 103 according to position coordinates of the target test platform 102 and current position coordinates of the memory device.

In an exemplary embodiment of the present disclosure, the target test platform is added with a target test program. The target test platform may be added with a target test program of a unique type. Alternatively, the target test platform may be added with test programs of multiple types, and a target test program is determined from the multiple test programs according to a type of the memory device on the target test platform. The memory device may include the following types: memory module, memory module chip, and memory module substrate.

In an exemplary embodiment of the present disclosure, the memory device test system further includes a terminal, where the terminal includes a display interface. The test server may respond to a query request on the display interface, and acquire, according to identification information of a memory device in the query request, a test result of the memory device from the database.

In an exemplary embodiment of the present disclosure, the movable apparatus includes a mechanical arm and a console, where the console may control movement of the mechanical arm. For example, the console may receive an operation path, and thus control the mechanical arm to move the memory device according to the operation path. One or more clamping jaw mechanisms are provided above the mechanical arm, where each clamping jaw mechanism may grab the memory device and move along with the mechanical arm. The clamping jaw mechanisms may be of different types. The different types of clamping jaw mechanisms grab memory devices of corresponding types. For example, a memory module clamping jaw mechanism grabs a memory module, a memory module chip clamping jaw mechanism grabs a memory module chip, and a memory module substrate clamping jaw mechanism grabs a memory module substrate.

In an exemplary embodiment of the present disclosure, the memory device test system further includes a scanning device. The scanning device may scan identification codes of the memory device and the target test platform, so as to obtain identification information of the memory device, a type of the memory device, and identification information of the target test platform. For example, the scanning device may include a scanner. The identification code may be a two-dimensional code; the scanner scans the two-dimensional code on the memory device to obtain the identification information of the memory device and/or the type of the memory device, and the scanner scans the two-dimensional code on the target test platform to obtain the identification information of the target test platform. The scanning device may be disposed on the movable apparatus, for example, disposed above the mechanical arm.

In an exemplary embodiment of the present disclosure, a height sensor is disposed on the movable apparatus. The height sensor may be disposed on the target test platform or on the mechanical arm, and the height sensor may detect a distance between the mechanical arm and the target test platform.

In an exemplary embodiment of the present disclosure, the memory device test system further includes a color sensor, where the color sensor may be disposed on the target test platform. The target test platform may send a test state and a current test result of the memory device to the color sensor, where the test state of the target test platform or the current test result of the memory device are represented by the color variation of the color sensor.

Figure 2:
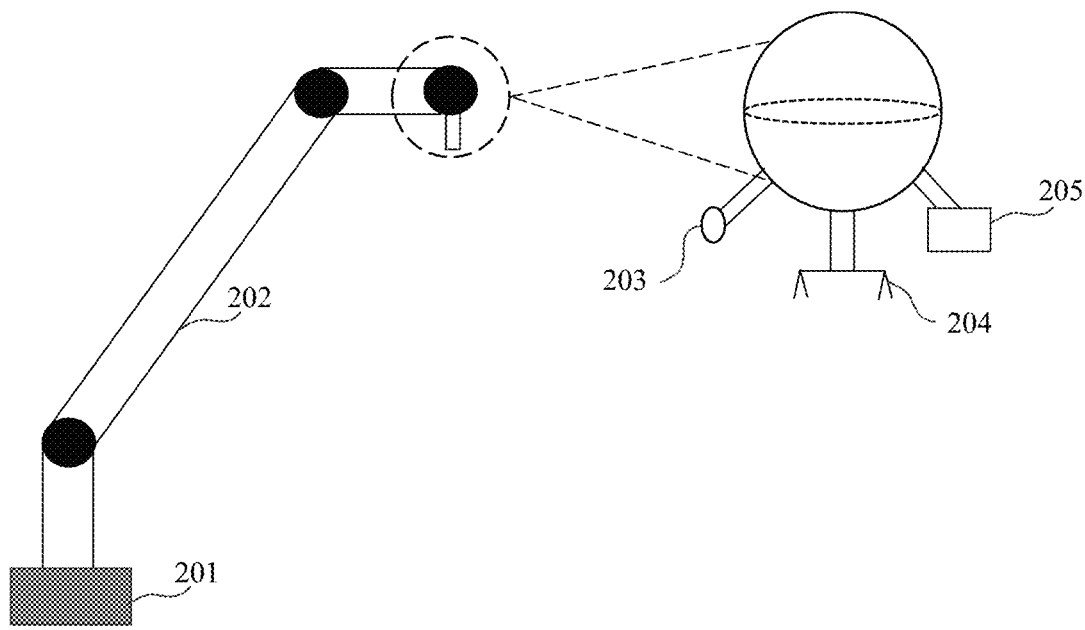
FIG. 2 is a schematic structural diagram of a movable apparatus according to an embodiment of the present disclosure.

For example, FIG. 2 is a schematic structural diagram of a movable apparatus according to this embodiment. As shown in FIG. 2, the movable apparatus includes a console 201 and a mechanical arm 202, where a clamping jaw mechanism 203, a clamping jaw mechanism 204, and a scanner 205 are installed above the mechanical arm 202. The clamping jaw mechanism 203 is a memory module chip clamping jaw mechanism, configured to grab a memory module chip; the clamping jaw mechanism 204 is a memory module clamping jaw mechanism, configured to grab a memory module.

Figure 3:
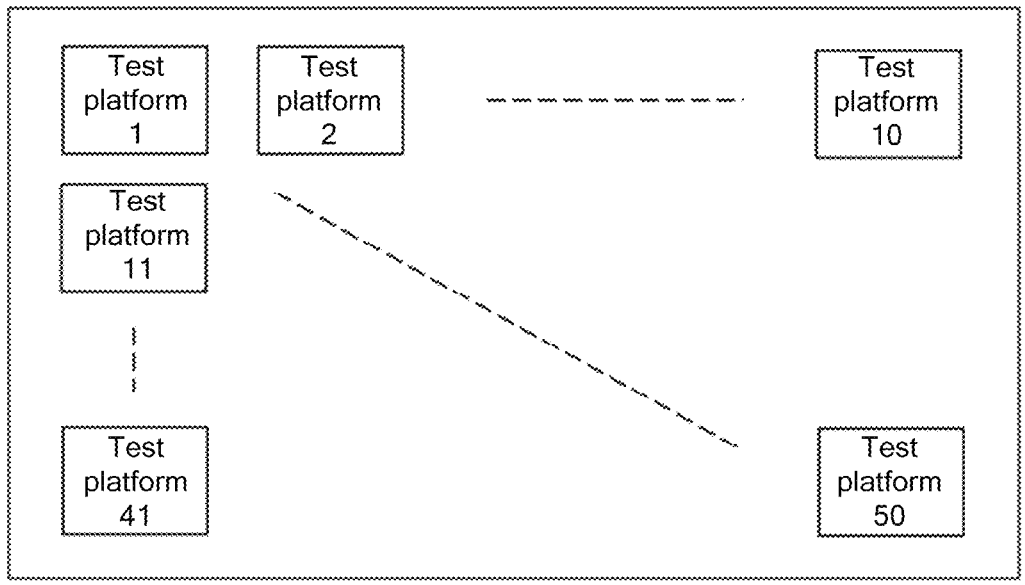
FIG. 3 is a schematic structural diagram of a test platform according to an embodiment of the present disclosure.

FIG. 3 is a schematic structural diagram of a test platform according to this embodiment. As shown in FIG. 3, the memory device test system includes 50 test platforms, where the 50 test platforms may be classified. For example, test platform 1 to test platform 20 are configured to test memory modules, test platform 21 to test platform 40 are configured to test memory module chips, and test platform 41 to test platform 50 are configured to test memory module substrates. In addition, a memory module test program is added to each of test platform 1 to test platform 20, a memory module chip test program is added to each of test platform 21 to test platform 40, and a memory module substrate test program is added to each of test platform 41 to test platform 50.

It should be noted that, the memory device test method provided by this embodiment of the present disclosure is generally executed by a test server, and correspondingly, the memory device test apparatus is generally set in the test server. However, in other embodiments of the present disclosure, the memory device test method provided by this embodiment of the present disclosure may alternatively be executed by a memory device test apparatus.

In the related art of this field, there are two methods for testing a memory device: one is to develop a test platform to test the memory device, and the other is to directly test the memory device in equipment where the memory device is applied. However, the two test methods both require manual testing, which has low test accuracy and also consumes lots of labor and material resources.

Figure 4:
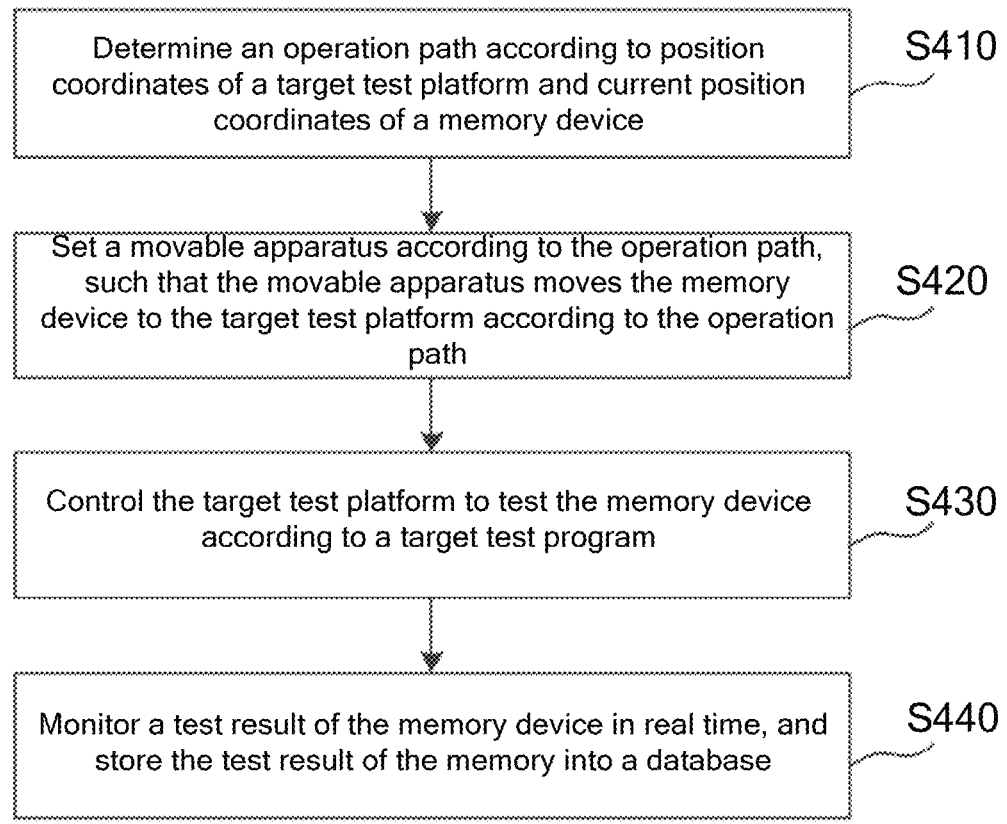
FIG. 4 is a schematic flowchart of a memory device test method according to an embodiment of the present disclosure.

An embodiment of the present disclosure provides a memory device test method, which is applied to a memory device test system. FIG. 4 is a schematic flowchart of a memory device test method. As shown in FIG. 4, the memory device test method includes at least the following steps:

Step S410: Determine an operation path according to position coordinates of a target test platform and current position coordinates of a memory device.

Step S420: Set a movable apparatus according to the operation path, such that the movable apparatus moves the memory device into the target test platform according to the operation path.

Step S430: Control the target test platform to test the memory device according to a target test program.

Step S440: Monitor a test result of the memory device in real time, and store the test result of the memory into a database.

The memory device test method in this embodiment of the present disclosure can automatically test the memory device through the data interaction among the test server, the movable apparatus, and the target test platform, which improves the test efficiency and test accuracy. Moreover, the memory device test method of the present disclosure completely replaces manual testing and avoids the system consumption caused by human errors, saving labor and material costs.

To make the technical solution of the present disclosure clearer, the following describes each step of the memory device test method.

In step S410, the operation path is determined according to the position coordinates of the target test platform and the current position coordinates of the memory device.

In an exemplary embodiment of the present disclosure, the position coordinates of the target test platform and the current position coordinates of the memory device are acquired, and the operation path is calculated according to the position coordinates of the target test platform and the current position coordinates of the memory device. The operation path may be a straight-line path or a curve path. The operation path may be planned according to an actual application scenario.

For example, a straight-line path between two points may be calculated according to the position coordinates of the target test platform and the current position coordinates of the memory device. A target point may further be set, and a straight-line path or a curve path is planned according to the position coordinates of the target test platform, position coordinates of the target point, and the current position coordinates of the memory device. The present disclosure does not specifically limit the method for determining the operation path.

In an exemplary embodiment of the present disclosure, before the operation path is determined according to the position coordinates of the target test platform and the current position coordinates of the memory device, a test state of each test platform is acquired; and a test platform in an idle state is configured as the target test platform.

The test state of the test platform includes an under test state, an offline state, an idle state, etc. The under test state means that a memory device is placed on the test platform, and the test platform is testing the memory device. The offline state means that a memory device is placed on the test platform, and the test platform has a test failure in the process of testing the memory device, which interrupts the test. The idle state means that no memory device is placed on the test platform, and the test platform is in a test waiting state. Definitely, the test state may be other test states, which are not specifically limited in the present disclosure.

In an exemplary embodiment of the present disclosure, the test state of the test platform is acquired through a color sensor, and a test platform in an idle state is configured as the target test platform. The test state of the test platform may be represented by the color sensor, and the color variation of the test platform is obtained through the color variation of the color sensor. For example, it is configured that the test state represented by a first color of the color sensor is the under test state, the test state represented by a second color is the offline state, and the test state represented by a third color is the idle state, where the first color, the second color, and the third color may be any different colors. Definitely, the test state includes multiple states, and the color sensor also displays multiple different colors, which are not specifically limited in the present disclosure.

If two or more test platforms among the multiple test platforms are in the idle state, any of the test platforms in the idle state may be configured as the target test platform, or the target test platform may be determined from multiple test platforms in the idle state according to other screening conditions.

In an exemplary embodiment of the present disclosure, the type of the memory device is matched with the multiple test platforms; and a test platform matching the type of the memory device is configured as the target test platform, where the type of the memory device is associated with the target test platform.

Multiple types of test platforms are configured in the memory device test system, including a memory module test platform, a memory module chip test platform, and a memory module substrate test platform, where the different types of test platforms test corresponding types of memory devices respectively.

In an exemplary embodiment of the present disclosure, the memory device may be scanned with a scanning device, to obtain the type of the memory device. The type of the memory device is matched with the multiple test platforms, and a test platform matching the type of the memory device is configured as the target test platform. For example, if the memory device is a memory module, the memory module test platform is used as the target test platform.

In step S420, the movable apparatus is set according to the operation path, such that the movable apparatus moves the memory device into the target test platform according to the operation path.

In an exemplary embodiment of the present disclosure, the operation path is sent to the console of the movable apparatus, and the console controls the mechanical arm, such that the mechanical arm moves the memory device into the target test platform according to the operation path.

In an exemplary embodiment of the present disclosure, the operation path includes a target point, which is at a preset distance from the target test platform. When the memory device is moved to the target point, the height sensor detects a target distance between the mechanical arm and the target test platform.

The target point may be set at any point above the target test platform. For example, the target point is set right above the target test platform. In addition, the target point is at the preset distance from the target test platform. The preset distance may be set according to actual situations, and the position of the target point is not specifically limited in the present disclosure.

In an exemplary embodiment of the present disclosure, if the target distance is less than the preset distance, it indicates that there is a memory device under test on the target test platform. Therefore, when the target distance is less than the preset distance, a new target test platform is configured; and a new operation path is determined according to position coordinates of the new target test platform and current position coordinates of the memory device. Other test platforms may be matched with the type of the memory device, and a test platform matching the type of the memory device is configured as the new target test platform.

In an exemplary embodiment of the present disclosure, if the target distance is less than the preset distance, a process of the memory device test method is as follows: First, if the target distance is less than the preset distance, a new target test platform is configured.

Next, if current position coordinates of the memory device are position coordinates of the target point, a new operation path is determined according to the position coordinates of the target point and position coordinates of the new target test platform, and the new operation path is sent to the movable apparatus, such that the movable apparatus moves into the new target test platform according to the new operation path.

Then, while the movable apparatus moves to the memory device, the new operation path includes a target point, and when the memory device is moved to the target point, the height sensor detects a target distance between the mechanical arm and the target test platform.

The foregoing steps are repeated, until the target distance is equal to the preset distance. The movable apparatus places the memory device on the new target test platform, and the new target test platform is controlled to test the memory device according to the target test program.

In an exemplary embodiment of the present disclosure, a target clamping jaw mechanism is determined from multiple clamping jaw mechanisms according to the type of the memory device; the console controls the target clamping jaw mechanism to grab the memory device, and controls the mechanical arm to move the memory device into the target test platform according to the operation path.

The mechanical arm includes multiple clamping jaw mechanisms, where the clamping jaw mechanisms can grab memory devices, and the clamping jaw mechanisms may be provided as different types of clamping jaw mechanisms according to the types of the memory devices. For example, the clamping jaw mechanisms may include a memory module clamping jaw mechanism, a memory module chip clamping jaw mechanism, and a memory module substrate clamping jaw mechanism, where the memory module clamping jaw mechanism, the memory module chip clamping jaw mechanism, and the memory module substrate clamping jaw mechanism are of different structures.

In an exemplary embodiment of the present disclosure, a target clamping jaw mechanism is determined from the multiple clamping jaw mechanisms according to the type of the memory device. The type of the memory device is matched with the multiple clamping jaw mechanisms, and a clamping jaw mechanism matching the type of the memory device is used as the target clamping jaw mechanism for the memory device.

For example, the target clamping jaw mechanism is associated with the type of the memory device. If the type of the memory device is memory module, the target clamping jaw mechanism is a memory module clamping jaw mechanism. The console controls the memory module clamping jaw mechanism to grab the memory module, and controls the mechanical arm to move the memory module into the target test platform according to the operation path. If the type of the memory device is memory module chip, the target clamping jaw mechanism is a memory module chip clamping jaw mechanism. The console controls the memory module chip clamping jaw mechanism to grab the memory module chip, and controls the mechanical arm to move the memory module chip into the target test platform according to the operation path. If the type of the memory device is memory module substrate, the target clamping jaw mechanism is a memory module substrate clamping jaw mechanism. The console controls the memory module substrate clamping jaw mechanism to grab the memory module substrate, and controls the mechanical arm to move the memory module substrate into the target test platform according to the operation path.

In an exemplary embodiment of the present disclosure, the scanning device scans identification codes of the memory device and the target test platform to obtain identification information of the memory device, the type of the memory device, and identification information of the target test platform.

The identification information of the memory device includes a unique identifier of the memory device, a serial number of the memory device, or the like; the identification information of the target test platform may be a unique identifier of the target test platform, a serial number of the test platform, or the like.

In an exemplary embodiment of the present disclosure, the scanning device may scan the identification codes on the memory device and the test platform to determine the identification information of the memory device, and the type of the memory device is determined from the database according to the identification information of the memory device.

In an exemplary embodiment of the present disclosure, a mapping relationship is formed according to the identification information of the memory device and the identification information of the target test platform, and the mapping relationship between the memory device and the target test platform is stored in the database.

In step S430, the target test platform is controlled to test the memory device according to the target test program.

In an exemplary embodiment of the present disclosure, a target test program is determined from multiple test programs according to the type of the memory device; and the target test program is added to the target test platform, such that the target test platform runs the target test program.

In an exemplary embodiment of the present disclosure, the type of the memory device is matched with multiple test programs, and a test program matching the type of the memory device is configured as the target test program.

The type of the memory device is associated with the target test program. The target test program may be used to test the memory device. Since memory devices include a memory module, a memory module chip, and a memory module substrate, test programs for testing the memory device include a memory module test program, a memory module chip test program, and a memory module substrate test program accordingly. Different test programs are used to test different types of memory devices.

In step S440, the test result of the memory device is monitored in real time, and the test result of the memory device is stored into the database.

In an exemplary embodiment of the present disclosure, the test result of the memory device monitored in real time on the target test platform is displayed on a display interface, such that an operator can acquire test results of memory devices on all target test platforms in real time. The test result of the memory device includes test passed and test failed.

In an exemplary embodiment of the present disclosure, the test result of the memory device may be acquired from the database according to the identification information of the memory device, and the test result is displayed in the display interface. In other words, an operator may trigger a query button on the display interface to form a query request, where the query request may include identification information of one or more memory devices. After receiving the query request, the test server finds the test result(s) of one or more memory devices in the database according to the identification information of the one or more memory devices, and sends the test result(s) of the one or more memory devices to the terminal, such that the terminal displays the test result(s) of the one or more memory devices on the display interface.

In an exemplary embodiment of the present disclosure, the display interface can also display test states of all the test platforms and the current test result of the memory device in real time, and change the display content with the test states of the test platforms and the current test result of the memory device.

In an exemplary embodiment of the present disclosure, the current test result of the memory device being tested on the target test platform can be represented by the color sensor on the target test platform. For example, a mapping relationship between the color information on the color sensor and the current test result of the memory device is set. For example, if the current test result of the memory device is test passed, the color sensor on the target test platform displays a fourth color; if the current test result of the memory device is test failed, the color sensor on the target test platform displays a fifth color. The fourth color and the fifth color are any different colors. The fourth color and the fifth color are also different from the first color, the second color, and the third color in the foregoing embodiment.

Figure 5:
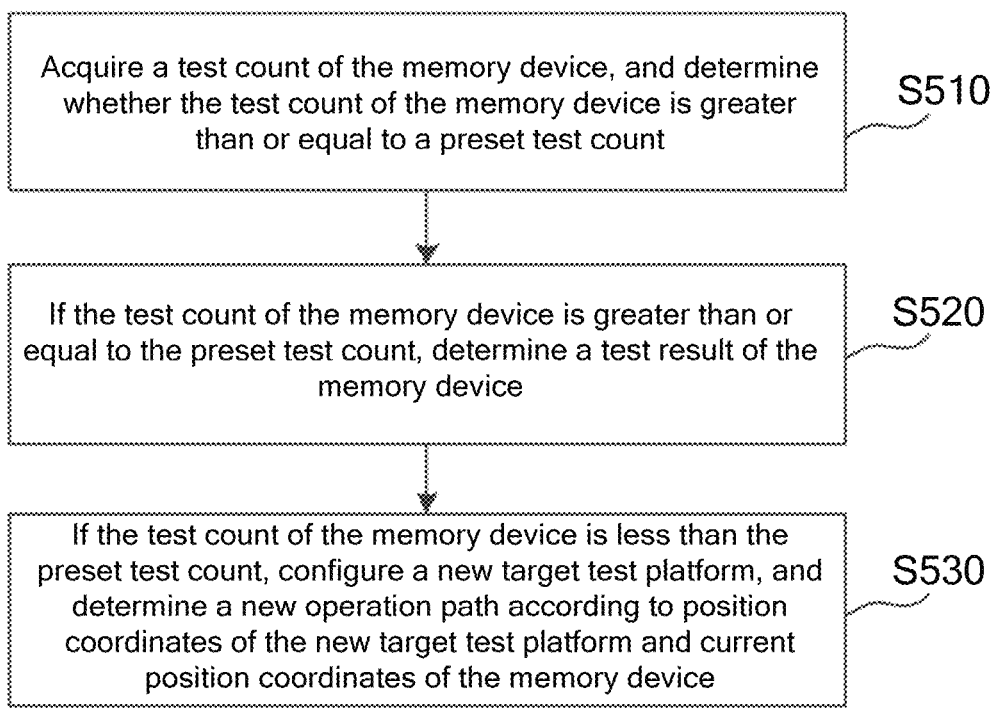
FIG. 5 is a schematic flowchart of determining a test result of a memory device according to an embodiment of the present disclosure.

In an exemplary embodiment of the present disclosure, FIG. 5 shows a schematic flowchart of determining a test result of a memory device. As shown in FIG. 5, the process includes at least step S510 to step S530, which are described in detail as follows:

In step S510, a test count of the memory device is acquired, and it is determined whether the test count of the memory device is greater than or equal to a preset test count.

In an exemplary embodiment of the present disclosure, the preset test count may be set according to actual situations, which may be set to 3, 5, or the like, which is not specifically limited in the present disclosure. For example, the preset test count may be adjusted based on the accuracy of the target test program. If the test accuracy of the target test program is relatively low, a relatively high preset test count is set, to improve the accuracy of the test result; if the test accuracy of the target test program is relatively high, a relatively low preset test count is set, to improve the test efficiency of the memory device and reduce the system consumption.

In an exemplary embodiment of the present disclosure, the preset test count may also be adjusted according to an online time of the target test program. For example, when the target test program is online for a short time, a relatively high preset test count is set. As the online time of the target test program increases and the target test program is updated, a relatively low preset test count is set.

In an exemplary embodiment of the present disclosure, the memory device may be tested multiple times on the same target test platform, or the memory device may be tested by multiple target test platforms respectively. Test information of the target test platform for the memory device is recorded. The test information includes a test start time point, a test end time point, the identification information of the target test platform, the identification information of the memory device, the current test result of the memory device, the identification information of the target test program, the test count of the memory device, etc. If the memory device is tested by multiple target test platforms, the test information includes identification information of multiple target test platforms, identification information of one or more target test programs, and current test results of the multiple memory devices, as well as multiple pairs of test start time points and test end time points.

In an exemplary embodiment of the present disclosure, the test count of the memory device is acquired according to the identification information of the memory device, and the preset test count is acquired, to determine whether the test count of the memory device is greater than or equal to the preset test count.

In step S520, if the test count of the memory device is greater than or equal to the preset test count, the test result of the memory device is determined.

In an exemplary embodiment of the present disclosure, if the preset test count is one, the current test result of the memory device is configured as the test result of the memory device on the target test platform.

In an exemplary embodiment of the present disclosure, the current test result of the memory device may be directly acquired from the test information. The method for determining the current test result of the memory device is as follows: first, color information of the color sensor on the target test platform is monitored in real time; then, the color information of the color sensor is analyzed according to a mapping relationship between color information of the color sensor and current test results of the memory device; finally, the current test result of the memory device on the target test platform is acquired according to an analysis result. The analysis of the color information of the color sensor includes: the color information of the color sensor is matched with the mapping relationship between color information and current test results, to acquire the current test result corresponding to the color information of the color sensor.

In an exemplary embodiment of the present disclosure, if the preset test count is two or more, multiple current test results corresponding to the memory device and the test count of the memory device are acquired according to the identification information of the memory device, and the test result of the memory device is determined based on a preset rule according to the multiple test results and the test count of the memory device.

In an exemplary embodiment of the present disclosure, the preset rule may be as follows: if the number of results of test passed among the multiple current test results is greater than half of the test count, the test result of the memory device is test passed. The preset rule may alternatively be as follows: if the number of results of test passed among the multiple current test results is greater than ⅔ of the test count, the test result of the memory device is test passed. The preset rule may alternatively be as follows: if multiple current test results include only one result of test failed, and all other current test results are test passed, the test result of the memory device is test passed. Definitely, the preset rule may be set according to actual situations, which is not specifically limited in the present disclosure.

In step S530, if the test count of the memory device is less than the preset test count, a new target test platform is configured, and a new operation path is determined according position coordinates of the new target test platform and current position coordinates of the memory device.

In an exemplary embodiment of the present disclosure, if the test count of the memory device is less than the preset test count, a new target test platform is determined from test platforms in the idle state according to the type of the memory device. The new target test platform is associated with the type of the memory device.

Figure 6:
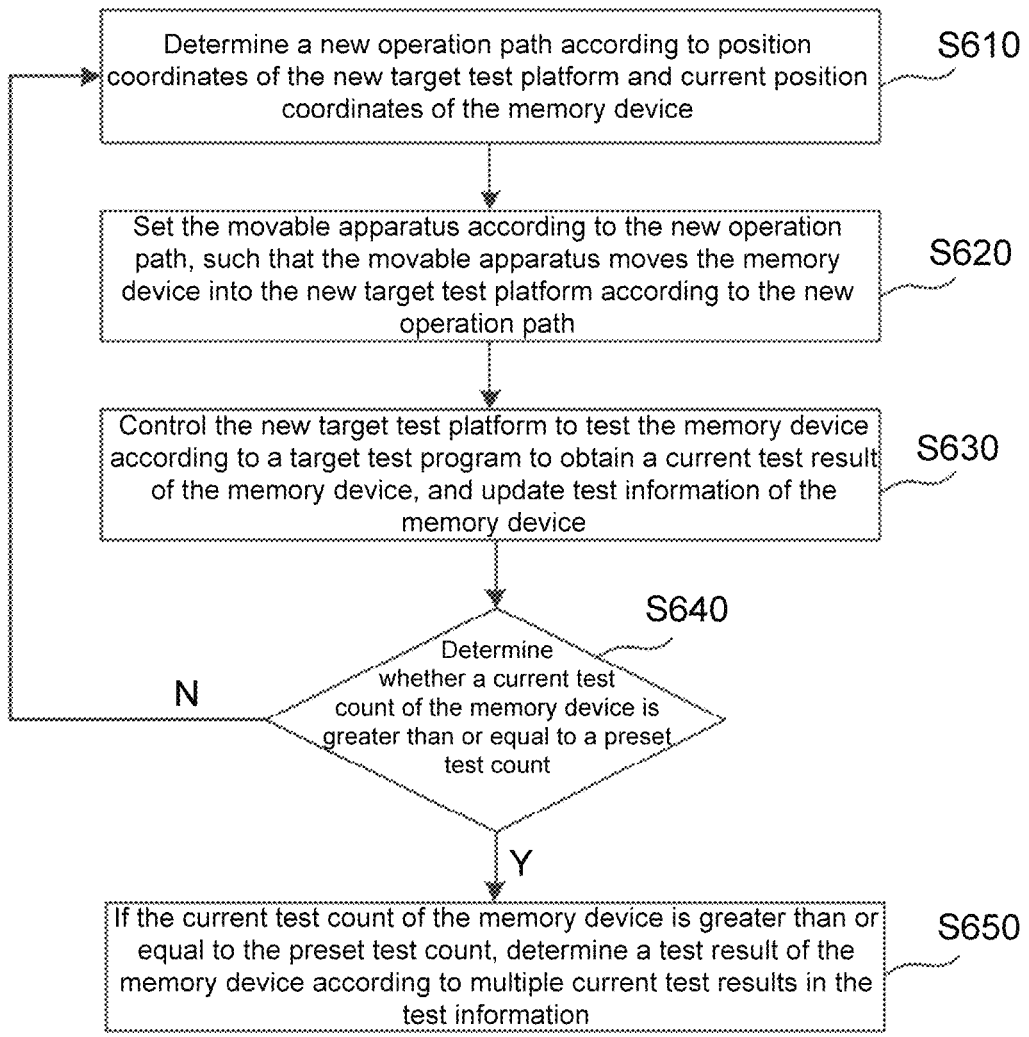
FIG. 6 is a schematic flowchart of determining a test result of a memory device according to an embodiment of the present disclosure.

In an exemplary embodiment of the present disclosure, FIG. 6 shows a schematic flowchart of a method for determining a test result of a memory device. As shown in FIG. 6, the process includes at least step S610 to step S650, which are described in detail as follows:

In step S610, a new operation path is determined according to position coordinates of the new target test platform and current position coordinates of the memory device.

The current position coordinates of the memory device are the position coordinates of the current target test platform.

In step S620, the movable apparatus is set according to the new operation path, such that the movable apparatus moves the memory device into the new target test platform according to the new operation path.

In step S630, the new target test platform is controlled to test the memory device according to a target test program to obtain a current test result of the memory device, and the test information of the memory device is updated.

Updating the test information of the memory device includes: adding the identification information of the new target test platform and the current test result of the memory device to the test information, and incrementing the test count by one, to obtain a current test count.

In step S640, it is determined whether the current test count of the memory device is greater than or equal to the preset test count.

In step S650, if the current test count of the memory device is greater than or equal to the preset test count, a test result of the memory device is determined according to multiple current test results in the test information.

If the current test count of the memory device is less than the preset test count, the foregoing step S610 to step S640 are repeated, until the test result of the memory device is obtained.

Those skilled in the art can understand that all or some of the steps in the foregoing embodiments can be implemented as a computer program executed by a CPU. When the computer program is executed by the CPU, the foregoing functions defined by the above method provided by the present disclosure are executed. The program may be stored in a computer readable storage medium. The storage medium may be a read-only memory, a magnetic disk, or an optical disc, etc.

In addition, it should be noted that, the foregoing accompanying drawings are merely schematic illustrations of the processing included in the method according to the exemplary embodiments of the present disclosure, and are not intended for limitation. It is easily understood that the processes shown in the foregoing accompanying drawings does not indicate or limit a chronological sequence of these processes. In addition, it is also easily understood that these processes can be performed synchronously or asynchronously, for example, in a plurality of modules.

An apparatus embodiment of the present disclosure is described below, which can be used to execute the foregoing memory device test method of the present disclosure. For details not disclosed in the apparatus embodiment of the present disclosure, refer to the foregoing embodiment of the memory device test method of the present disclosure.

Figure 7:
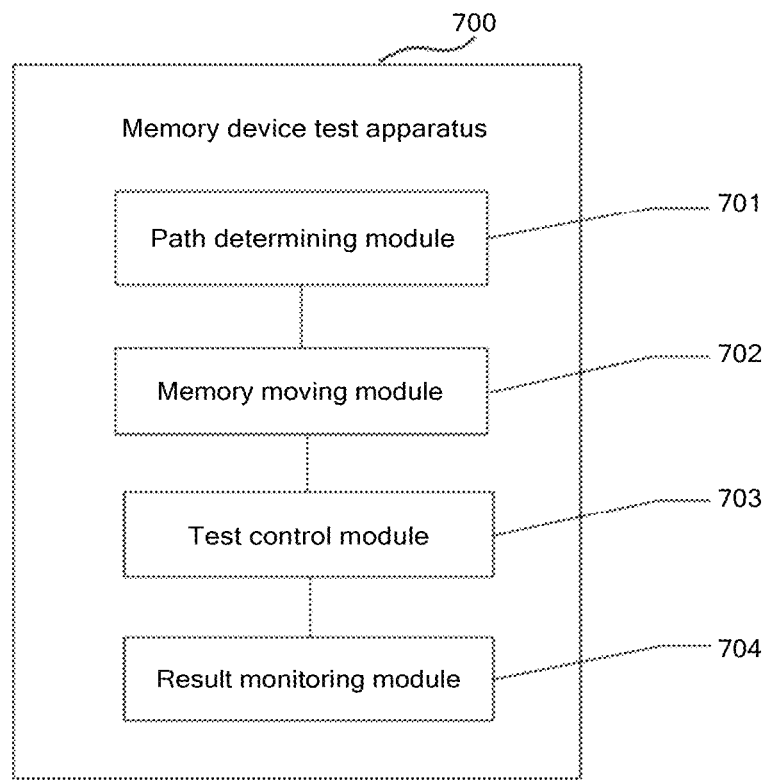
FIG. 7 is a schematic block diagram of a memory device test apparatus according to an embodiment of the present disclosure.

FIG. 7 is a schematic block diagram of a memory device test apparatus according to an embodiment of the present disclosure.

FIG. 7 shows a memory device test apparatus 700 according to an embodiment of the present disclosure. The memory device test apparatus 700 includes: a path determining module 701, a memory moving module 702, a test control module 703, and a result monitoring module 704.

The path determining module 701 is configured to determine an operation path according to position coordinates of a target test platform and current position coordinates of a memory device.

The memory moving module 702 is configured to set a movable apparatus according to the operation path, such that the movable apparatus moves the memory device into the target test platform according to the operation path.

The test control module 703 is configured to control the target test platform to test the memory device according to a target test program.

The result monitoring module 704 is configured to monitor a test result of the memory device in real time, and store the test result of the memory device into a database.

In an exemplary embodiment of the present disclosure, the movable apparatus includes a mechanical arm and a console, and the memory moving module 702 may be further configured to send the operation path to the console and control the mechanical arm through the console, such that the mechanical arm moves the memory device into the target test platform according to the operation path.

In an exemplary embodiment of the present disclosure, the mechanical arm includes multiple clamping jaw mechanisms, and the memory moving module 702 may be further configured to determine a target clamping jaw mechanism from the multiple clamping jaw mechanisms according to a type of the memory device; and control, through the console, the target clamping jaw mechanism to grab the memory device, and control the mechanical arm to move the memory device into the target test platform according to the operation path.

In an exemplary embodiment of the present disclosure, the memory device test apparatus 700 further includes a scanning module (not shown in the figure), and the scanning module is configured to scan, through a scanning device, identification codes of the memory device and the target test platform, to obtain identification information of the memory device, the type of the memory device, and identification information of the target test platform.

In an exemplary embodiment of the present disclosure, the memory device test apparatus 700 further includes a target program determining module (not shown in the figure), and the target program determining module is configured to add the target test program to the target test platform according to the type of the memory device, such that the target test platform runs the target test program.

In an exemplary embodiment of the present disclosure, the memory device test apparatus 700 further includes a first target platform determining module (not shown in the figure), and the first target platform determining module is configured to acquire a test state of each test platform through a color sensor; and configure a test platform in an idle state as the target test platform.

In an exemplary embodiment of the present disclosure, the memory device test apparatus 700 further includes a second target platform determining module (not shown in figure), and the second target platform determining module is configured to match the type of the memory device and multiple test platforms; and configure a test platform matching the type of the memory device as the target test platform.

In an exemplary embodiment of the present disclosure, the memory device test apparatus 700 further includes a third target platform determining module (not shown in the figure), and the third target platform determining module is configured to detect a target distance between the mechanical arm and the target test platform through a height sensor when the memory device is moved to a target point, where the operation path includes a target point, and the target point is at a preset distance from the target test platform.

In an exemplary embodiment of the present disclosure, the third target platform determining module may be further configured to: configure a new target test platform when the target distance is less than a preset distance; and determine a new operation path according to position coordinates of a new target test platform and current position coordinates of the memory device.

In an exemplary embodiment of the present disclosure, the memory device test apparatus 700 further includes a result determining module (not shown in the figure), and the result determining module is configured to acquire a test count of the memory device, and determine whether the test count of the memory device is greater than or equal to a preset test count; if yes, determine the test result of the memory device; if not, configure a new target test platform, and determine a new operation path according to position coordinates of the new target test platform and current position coordinates of the memory device.

In an exemplary embodiment of the present disclosure, the memory device test apparatus 700 further includes a result display module (not shown in the figure), and the result display module is configured to acquire the test result of the memory device from the database according to the identification information of the memory device, and display the test result on a display interface.

The specific details of each of the memory device test apparatuses described above have been described in the corresponding memory device test method and are therefore not repeated here.

It should be noted that although a number of modules or units of the device for execution are mentioned in the detailed description above, this division is not mandatory. In fact, according to the embodiments of the present disclosure, the features and functions of two or more modules or units described above may be implemented in a single module or unit. Conversely, the features and functions of one module or unit described above may be further divided to be implemented by multiple modules or units.

In the exemplary embodiments of the present disclosure, an electronic device capable of implementing the method described above is further provided.

Those skilled in the art can understand that various aspects of the present disclosure can be implemented as a system, a method, or a program product. Therefore, various aspects of the present disclosure may be specifically implemented in the form of a hardware-only implementation, a software-only implementation (including firmware, microcode, etc.), or a combination of hardware and software aspects, which may be collectively referred to herein as a "circuit," "module," or "system."

An electronic device 800 according to this embodiment of the present disclosure is described below with reference to FIG. 8. The electronic device 800 shown in FIG. 8 is merely an example, and should not cause any limitation to the functions and application range of the embodiments of the present disclosure.

Figure 8:
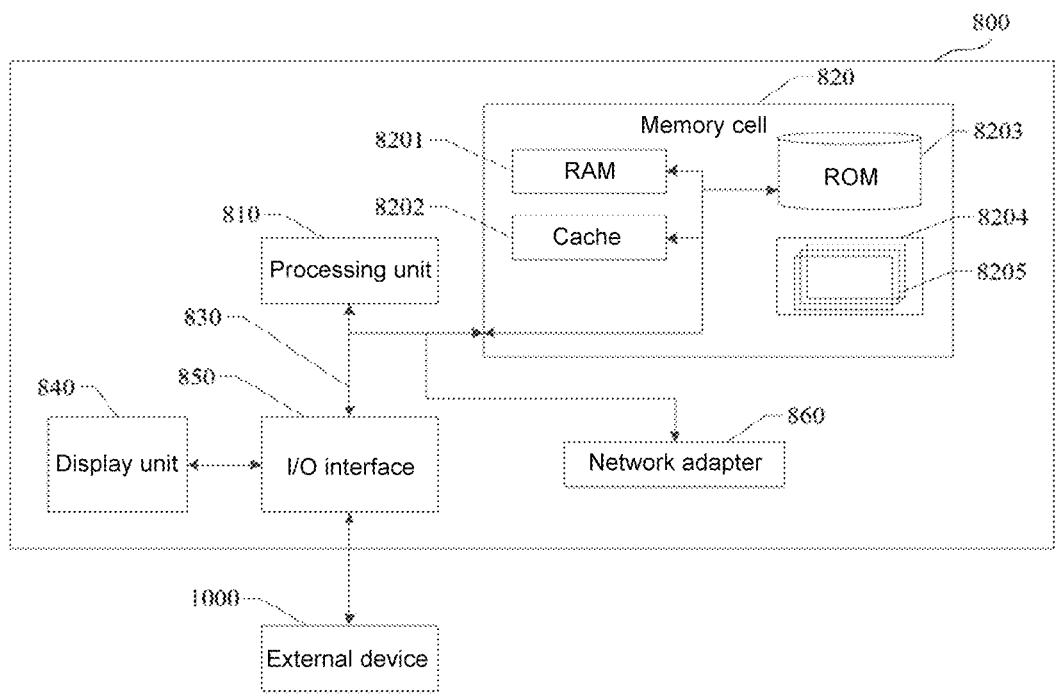
FIG. 8 is a schematic diagram of modules of an electronic device according to an embodiment of the present disclosure.

As shown in FIG. 8, the electronic device 800 is represented in the form of a general purpose computing device. The components of the electronic device 800 may include, but are not limited to, at least one processing unit 810 described above, at least one memory cell 820 described above, a bus 830 connecting different system components (including the memory cell 820 and the processing unit 810), and a display unit 840.

The memory cell stores program code. The program code may be executed by the processing unit 810 to cause the processing unit 810 to perform the steps according to the various exemplary embodiments of the present disclosure described in the foregoing "exemplary methods" of this specification. For example, the processing unit 810 may execute step S410 of determining an operation path according to position coordinates of a target test platform and current position coordinates of a memory device; step S420 of setting a movable apparatus according to the operation path, such that the movable apparatus moves the memory device into the target test platform according to the operation path; step S430 of controlling the target test platform to test the memory device according to a target test program; and step S440 of monitoring a test result of the memory device in real time, and storing the test result of the memory device into a database, as shown in FIG. 4.

The memory unit 820 may include a readable medium in the form of a volatile memory cell, such as a random access memory cell (RAM) 8201 and/or a cache memory cell 8202, and may further include a read-only memory cell (ROM) 8203.

The memory unit 820 may also include a program/utility 8204 having a set of (at least one) program modules 8205. Such program modules 8205 include, but are not limited to: an operating system, one or more application programs, other program modules, and program data, and each of these examples or some combination thereof may include an implementation of a network environment.

The bus 830 may represent one or more of several types of bus structures, including a memory unit bus or a memory unit controller, a peripheral bus, a graphics acceleration port, a processing unit, or a local area bus using any bus structure using among a plurality of bus structures.

The electronic device 800 may also communicate with one or more external devices 1000 (e.g., a keyboard, a pointing device, a Bluetooth device, etc.), and may also communicate with one or more devices that enable a viewer to interact with the electronic device 800, and/or with any device that enables the electronic device 800 to communicate with one or more other computing devices (e.g., a router, a modem, etc.). Such communication may be performed via an input/output (I/O) interface 850. Moreover, the electronic device 800 may also communicate with one or more networks (e.g., a local area network (LAN), a wide area network (WAN), and/or a public network, such as the Internet) through a network adapter 860. As shown in the figure, the network adapter 1060 communicates with other modules of the electronic device 800 via the bus 830. It should be appreciated that although not shown in the figure, other hardware and/or software modules may be used in conjunction with the electronic device 800, including but not limited to: microcode, device drives, redundant processing units, external disk drive arrays, RAID systems, tape drives, and data backup storage systems.

Through the foregoing description of the embodiments, persons skilled in the art may easily understand that the exemplary embodiments described herein may be implemented by software, or may be implemented by software in combination with necessary hardware. Therefore, the technical solutions according to the embodiments of the present disclosure may be implemented in a form of a software product. The software product may be stored in a non-volatile storage medium (which may be a CD-ROM, a USB flash drive, a removable hard disk, or the like), and includes a plurality of instructions to cause a computing device (which may be a personal computer, a server, a terminal apparatus, a network device, or the like) to perform the method according to the embodiments of the present disclosure.

In the exemplary embodiments of the present disclosure, a computer readable storage medium is further provided, which stores a program product that can implement the foregoing method in this specification. In some possible embodiments, various aspects of the present disclosure may also be implemented in the form of a program product including program code. When the program product is run on a terminal device, the program code is used to cause the terminal device to perform the steps according to the various exemplary embodiments of the present disclosure described in the foregoing "exemplary methods" of this specification.

Figure 9:
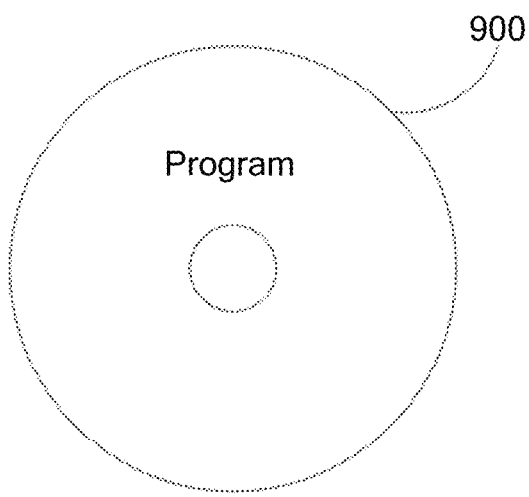
FIG. 9 is a schematic diagram of a program product according to an embodiment of the present disclosure.

Referring to FIG. 9, a program product 900 for implementing the above method according to an embodiment of the present disclosure is depicted, which may employ a portable compact disk read-only memory (CD-ROM) and include program code, and may run on a terminal device, such as a personal computer. However, the program product of the present disclosure is not limited to this. In this specification, the readable storage medium may be any tangible medium that contains or stores a program, and the program may be used by or in combination with an instruction execution system, apparatus, or device.

The program product may adopt one readable medium or any combination of multiple readable media. The readable medium may be a readable signal medium or a readable storage medium. The readable storage medium may be, for example, but not limited to, electrical, magnetic, optical, electromagnetic, infrared, or semiconductor systems, apparatuses, or devices, or any combination thereof. More specific examples (a non-exhaustive list) of the readable storage medium may include, but are not limited to: an electrical connection with one or more conducting wires, a portable computer disk, a hard disk, a RAM, a ROM, an erasable programmable ROM (an EPROM or a flash memory), an optical fiber, a portable compact disk read-only memory (CD-ROM), an optical storage device, a magnetic storage device, or any suitable combination thereof. The computer readable signal medium may include a data signal propagated in a baseband or as a part of a carrier, and computer readable program code is carried therein. The propagated data signal may be in various forms, including but not limited to an electromagnetic signal, an optical signal, or any suitable combination thereof. The readable signal medium may alternatively be any computer readable medium other than the readable storage medium. The readable medium may send, propagate, or transmit a program configured to be used by or in combination with an instruction execution system, apparatus, or device.

The program code contained in the readable medium may be transmitted using any suitable medium, including but not limited to: wireless, wire, optical fiber, RF, or any suitable combination thereof.

Program code for executing the operations in the present disclosure may be compiled by using one or any combination of more than one program design language. The programming languages include object oriented programming languages, such as Java and C++, and conventional procedural programming languages, such as C or similar programming languages. The program code can be executed fully on a user computing device, executed partially on a user computing device, executed as an independent software package, executed partially on a user computing device and partially on a remote computing device, or executed fully on a remote computing device or a server. In a circumstance in which a remote computing device is involved, the remote computing device may be connected to a user computing device via any type of network, including a local area network (LAN) or a wide area network (WAN), or may be connected to an external computing device (for example, connected via the Internet by using an Internet service provider).

In addition, the foregoing accompanying drawings are merely schematic illustrations of the processing included in the method according to the exemplary embodiments of the present invention, and are not intended for limitation. It is easily understood that the processes shown in the foregoing accompanying drawings does not indicate or limit a chronological sequence of these processes. In addition, it is also easily understood that these processes can be performed synchronously or asynchronously, for example, in a plurality of modules.

Those skilled in the art can readily figure out other embodiments of the present disclosure after considering the specification and practicing the content disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the claims. The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In memory device test method, apparatus and system, the medium, and the electronic device provided by the embodiments of the present disclosure, an operation path is determined according to position coordinates of a target test platform and current position coordinates of a memory device; a movable apparatus is set according to the operation path, such that the movable apparatus moves the memory device into the target test platform according to the operation path; the target test platform is controlled to test the memory device according to a target test program; and a test result of the memory device is monitored in real time, and the test result of the memory device is stored into a database. The memory device test method in the present disclosure can automatically test the memory device through the data interaction among the test server, the movable apparatus, and the target test platform, which improves the test efficiency and test accuracy. The memory device test method of the present disclosure completely replaces manual testing and avoids the system consumption caused by human errors, saving labor and material costs.

The invention claimed is:

1. A memory device test method, comprising:
    determining an operation path according to position coordinates of a target test platform and current position coordinates of a memory device;
    setting a movable apparatus according to the operation path, such that the movable apparatus moves the memory device into the target test platform according to the operation path, wherein the movable apparatus comprises a mechanical arm and a console, the operation path is sent to the console, and the mechanical arm is controlled through the console, such that the mechanical arm moves the memory device into the target test platform according to the operation path;
    controlling the target test platform to test the memory device according to a target test program; and
    monitoring a test result of the memory device in real time, and storing the test result of the memory device into a database;
    wherein the operation path comprises a target point, the target point is at a preset distance from the target test platform, and when the memory device is moved to the target point, a height sensor detects a target distance between the mechanical arm and the target test platform; and
    when the target distance is less than the preset distance, the method further comprises:
        configuring a new target test platform;
        determining a new operation path according to position coordinates of the new target test platform and the current position coordinates of the memory device, the current position coordinates of the memory device being position coordinates of the target point;
        sending the new operation path to the movable apparatus, such that the movable apparatus moves the memory device into the new target test platform according to the new operation path, the new operation path comprising a new target point;
        detecting a new target distance between the mechanical arm and the new target test platform through the height sensor when the memory device is moved to the new target point; and
        repeating the foregoing steps, until the new target distance is equal to a new preset distance, such that the movable apparatus places the memory device on the new target test platform, and the new target test platform is controlled to test the memory device according to the target test program.

2. The memory device test method according to claim 1, further comprising:
    scanning identification codes of the memory device and the target test platform through a scanning device, to obtain identification information of the memory device, a type of the memory device, and identification information of the target test platform.

3. The memory device test method according to claim 2, wherein before testing the memory device, the method further comprises:
    adding the target test program to the target test platform according to the type of the memory device, such that the target test platform runs the target test program.

4. The memory device test method according to claim 1, wherein before determining the operation path, the method further comprises:
    acquiring a test state of a test platform through a color sensor; and configuring the test platform as the target test platform when the test platform is in an idle state.

5. The memory device test method according to claim 1, further comprising:
matching a type of the memory device with multiple test platforms; and
configuring a test platform matching the type of the memory device as the target test platform.

6. The memory device test method according to claim 1, wherein the mechanical arm comprises multiple clamping jaw mechanisms;
a target clamping jaw mechanism is determined from the multiple clamping jaw mechanisms according to a type of the memory device; and
the target clamping jaw mechanism is controlled through the console to grab the memory device, and the mechanical arm is controlled to move the memory device into the target test platform according to the operation path.

7. The memory device test method according to claim 1, further comprising:
acquiring a test count of the memory device, and determining whether the test count of the memory device is greater than or equal to a preset test count; and
when the test count of the memory device is greater than or equal to the preset test count, determining the test result of the memory device; or
when the test count of the memory device is not greater than or equal to the preset test count, configuring the new target test platform, and determining the new operation path according to the position coordinates of the new target test platform and the current position coordinates of the memory device.

8. The memory device test method according to claim 1, further comprising:
acquiring the test result of the memory device from the database according to identification information of the memory device, and displaying the test result on a display interface.

9. A non-transitory computer readable storage medium, storing a computer program, wherein the computer program, when executed by a processor, implements the memory device test method according to claim 1.

10. A memory device test apparatus, comprising:
one or more processors; and
a storage apparatus, configured to store one or more programs, wherein the one or more programs, when executed by the one or more processors, cause the one or more processors to execute operations of:
determining an operation path according to position coordinates of a target test platform and current position coordinates of a memory device;
setting a movable apparatus according to the operation path, such that the movable apparatus moves the memory device into the target test platform according to the operation path, wherein the movable apparatus comprises a mechanical arm and a console, the operation path is sent to the console, and the mechanical arm is controlled through the console, such that the mechanical arm moves the memory device into the target test platform according to the operation path;
controlling the target test platform to test the memory device according to a target test program; and
monitoring a test result of the memory device in real time, and storing the test result of the memory device into a database;
wherein the operation path comprises a target point, the target point is at a preset distance from the target test platform, and when the memory device is moved to the target point, a height sensor detects a target distance between the mechanical arm and the target test platform; and
when the target distance is less than the preset distance, the operations further comprises:
configuring a new target test platform;
determining a new operation path according to position coordinates of the new target test platform and the current position coordinates of the memory device, the current position coordinates of the memory device being position coordinates of the target point;
sending the new operation path to the movable apparatus, such that the movable apparatus moves the memory device into the new target test platform according to the new operation path, the new operation path comprising a new target point;
detecting a new target distance between the mechanical arm and the new target test platform through the height sensor when the memory device is moved to the new target point; and
repeating the foregoing steps, until the new target distance is equal to a new preset distance, such that the movable apparatus places the memory device on the new target test platform, and the new target test platform is controlled to test the memory device according to the target test program.

11. A memory device test system, comprising a movable apparatus, a target test platform, and a test server, wherein
the movable apparatus is configured to receive an operation path, and move a memory device into the target test platform according to the operation path, wherein the movable apparatus comprises a mechanical arm and a console, the operation path is sent to the console, and the mechanical arm is controlled through the console, such that the mechanical arm moves the memory device into the target test platform according to the operation path;
the target test platform is configured to test the memory device according to a target test program in response to a test instruction;
the test server is configured to send the test instruction to the target test platform, monitor a test result of the memory device in real time, and store the test result of the memory device into a database;
the operation path is calculated by the test server according to position coordinates of the target test platform and current position coordinates of the memory device;
the operation path comprises a target point, the target point is at a preset distance from the target test platform, and when the memory device is moved to the target point, a height sensor detects a target distance between the mechanical arm and the target test platform; and
the memory device test system further comprises a memory device test apparatus, the memory device test apparatus is configured to, when the target distance is less than the preset distance:
configure a new target test platform;
determine a new operation path according to position coordinates of the new target test platform and the current position coordinates of the memory device, the current position coordinates of the memory device being position coordinates of the target point;

send the new operation path to the movable apparatus, such that the movable apparatus moves the memory device into the new target test platform according to the new operation path, the new operation path comprising a new target point;

detect a new target distance between the mechanical arm and the new target test platform through the height sensor when the memory device is moved to the new target point; and repeat the foregoing steps, until the new target distance is equal to a new preset distance, such that the movable apparatus places the memory device on the new target test platform, and the new target test platform is controlled to test the memory device according to the target test program.

12. The memory device test system according to claim 11, further comprising: a terminal that comprises a display interface, wherein the display interface is configured to display a test state of a test platform and the test result of the memory device.

13. The memory device test system according to claim 11, further comprising: a scanning device, wherein the scanning device is configured to scan identification codes of the memory device and the target test platform, to obtain identification information of the memory device, a type of the memory device, and identification information of the target test platform.

14. The memory device test system according to claim 11, further comprising: a color sensor, wherein the color sensor is configured to acquire a test state of a test platform and the test result of the memory device.

* * * * *